(12) United States Patent
Takase et al.

(10) Patent No.: US 10,044,339 B2
(45) Date of Patent: Aug. 7, 2018

(54) PIEZOELECTRIC DEVICE

(71) Applicant: DAISHINKU CORPORATION, Kakogawa-shi, Hyogo (JP)

(72) Inventors: Hidenori Takase, Kakogawa (JP); Masashi Hirai, Kakogawa (JP)

(73) Assignee: Daishinku Corporation, Hyogo (JP)

( * ) Notice: Subject to any disclaimer, the term of this patent is extended or adjusted under 35 U.S.C. 154(b) by 233 days.

(21) Appl. No.: 15/064,705

(22) Filed: Mar. 9, 2016

(65) Prior Publication Data

US 2017/0026028 A1    Jan. 26, 2017

(30) Foreign Application Priority Data

Mar. 11, 2015  (JP) .................................. 2015-048754
Mar. 24, 2015  (JP) .................................. 2015-060785
Dec. 25, 2015  (JP) .................................. 2015-253752

(51) Int. Cl.
  *H03H 9/10*  (2006.01)
  *H03H 9/05*  (2006.01)
  *H03H 9/17*  (2006.01)

(52) U.S. Cl.
  CPC ........ *H03H 9/1021* (2013.01); *H03H 9/0552* (2013.01); *H03H 9/17* (2013.01)

(58) Field of Classification Search
  CPC .. H01L 41/053; H03H 9/0552; H03H 9/1021; H03H 9/15; H03H 9/17; H03H 9/19
  USPC .......................................................... 310/348
  See application file for complete search history.

(56) References Cited

U.S. PATENT DOCUMENTS

2010/0290206 A1* 11/2010 Sugawara ............ H03H 9/0552
                                                              361/808
2015/0123737 A1*  5/2015 Yokoo .................. H03H 9/0552
                                                              331/34

FOREIGN PATENT DOCUMENTS

JP      2007-124513      5/2007
JP      2010-268193     11/2010

* cited by examiner

*Primary Examiner* — Derek Rosenau
(74) *Attorney, Agent, or Firm* — Norris McLaughlin & Marcus, P.A.

(57) ABSTRACT

A piezoelectric device has an insulated container including a frame portion. Four external connection terminals to be solder-bonded to an external substrate each have a shape with a bent portion in plan view in which the external connection terminal is extending from one of the four corners on a bottom surface of the frame portion in a long-side direction and a short-side direction of an outer peripheral edge of the frame portion. The four external connection terminals are spaced from an opening end of a recess with an electrode-absent region interposed therebetween. The four external connection terminals each have a plurality of angular parts in plan view, and at least one of the plurality of angular parts is in proximity to the inner peripheral edge of the frame portion in an arc shape or a chamfered shape at each of the four corners thereof.

7 Claims, 11 Drawing Sheets

F I G. 10
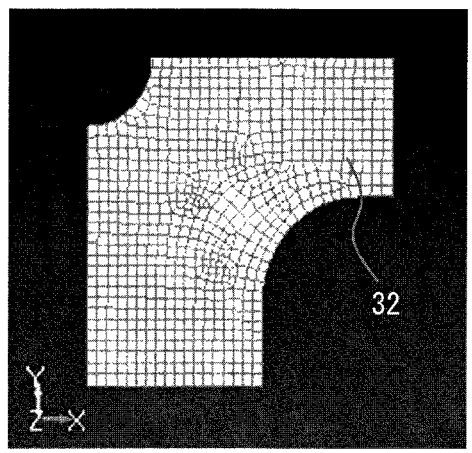

F I G. 1 1
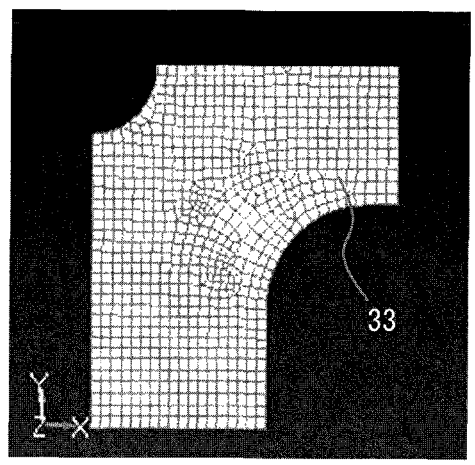

PIEZOELECTRIC DEVICE

TECHNICAL FIELD

This invention relates to a piezoelectric device of surface mounting type to be mounted on an external substrate by, for example, solder bonding. The device is suitable for mass production.

BACKGROUND ART

Conventionally, among piezoelectric devices that include piezoelectric vibrators and piezoelectric oscillators, the most common type of such devices is the surface mounting piezoelectric device bonded with a solder to a surface of an external substrate. Taking surface mounting crystal devices for instance, they may have a structure wherein a crystal element and an electronic component, for example, thermistor or semiconductor circuit element (IC), are mounted respectively on front and back surfaces of an insulated substrate portion and the crystal element is hermetically sealed with a lid. In this structure, the crystal element and the electronic component are separately housed in different spaces.

A further specific example of this structure may further have an insulated container (base). This base may have a lower recess and an upper recess. The lower recess is defined by the lower surface of a plate-shaped substrate portion (a main surface that faces the external substrate) and a frame formed on an outer peripheral part of the lower surface (lower frame). The upper recess is defined by the upper surface of the plate-shaped substrate portion (another main surface opposite to the main surface that faces the external substrate) and a frame formed on an outer peripheral part of the upper surface (upper frame). A crystal element is mounted in the upper recess of the base, while the electronic component, such as IC or thermistor, is mounted in the lower recess of the base. A plate-shaped lid is bonded to the base so as to close up the opening of the upper recess to hermetically seal the crystal element in the upper recess. The patent document 1 describes an example of the piezoelectric devices thus structured.

Referring to the cited document 1, external connection terminals are formed at four corners on the bottom surface of the lower frame in the base. A fact to be noted here is that the bottom surface of the lower frame is reduced to smaller dimensions in microminiaturized crystal devices in the size of, if they are rectangular in plan view, approximately 1.6 mm×1.2 mm or less in outside dimension. This means that an area available for the external connection terminals to be formed is accordingly smaller.

In this way it is from the next reasons that the area available for the external connection terminals to be formed becomes smaller. The electronic component to be mounted in the lower recess has at least a certain size or larger. To ensure better workability when mounting the electronic component in the lower recess, the lower recess needs to have an opening area large enough for the electronic component. This, in turn, narrows the lower frame in width and correspondingly narrows the bottom surface of the lower frame, leaving a further limited area for the external connection terminals.

As the bottom surface of the lower frame in the base is increasingly narrower, the lower frame has a proportionately lower rigidity. Then, the base may be likely to deflect under various stresses imposed thereon by the external substrate and the like.

To ensure a sufficient solder-bonding strength between such a microminiaturized crystal device and the external substrate, the external connection terminals are desirably larger but are small enough for such a limitedly narrow bottom surface of the lower frame. It follows that the external connection terminals may be essentially formed in proximity to the opening end of the lower recess as described in the patent document 2. In case the external connection terminals are too close to the opening end of the lower recess, however, the dissolved solder may flow out and reach an electronic component mounting pad (electrodes) on the inner bottom surface of the lower recess when the crystal device is mounted on the external substrate. This may increase the risks of poor insulation and other undesired events. To avoid such risks, a certain interval. i.e., an electrode-absent region where the base matrix is exposed, is desirably interposed between the inner peripheral edges of the external connection terminals and the opening edge of the lower recess.

A problem with the external connection terminal having a rectangular shape in plan view is its bent-shaped angular parts. These angular parts, where the stresses are prone to localize, may often be the origins of solder cracks. Besides that, the lower frame of the base in the microminiaturized crystal device degraded in rigidity, as described earlier, may easily cause the base to deflect under various stresses imposed thereon by the external substrate and the like. In case the base is deflected, the stresses are more likely to act on the solder-joined parts of the external connection terminals of the crystal device and to locally concentrate on the angular parts of the external connection terminals. These unfavorable events may involve the risk of generating cracks in the solder. Any crack, once it occurs in the solder, may spread, finally incurring poor connection and/or causing the crystal device to fall off.

PRIOR ART DOCUMENT

Patent Document

Patent Document 1: Unexamined Japanese Patent Applications Laid-Open No. 2007-124513
Patent Document 2: Unexamined Japanese Patent Applications Laid-Open No. 2010-268193

SUMMARY OF THE INVENTION

Problems to be Solved by the Invention

This invention was accomplished to solve these conventional technical problems. The invention provides a piezoelectric device advantageous in that the microminiaturization of crystal devices may be well-addressed, the likelihood of solder cracks may be effectively reducible, and high bonding reliability may be attainable.

Solutions to the Problem

To this end, the invention provides for the technical features hereinafter described.

A piezoelectric device according to the invention includes:

an insulated container having a substrate portion and a frame portion formed in an outer peripheral part of a main surface of the substrate portion that faces an external substrate;

an electronic component housed in a recess surrounded by the frame portion and the main surface of the substrate portion that faces the external substrate;

a piezoelectric element mounted on a main surface of the substrate portion opposite to the main surface mounted with the electronic component; and a lid for hermetic seal of the piezoelectric element, wherein the frame portion has an outer peripheral edge rectangular in plan view and an inner peripheral edge rectangular or square in plan view, and four corners on the inner peripheral edge of the frame portion have an arc shape or a chamfered shape in plan view, four external connection terminals to be solder-bonded to the external substrate each have a shape with a bent portion in plan view in which each of the external connection terminal is extending from each of the four corners on a bottom surface of the frame portion in a long-side direction and a short-side direction of the outer peripheral edge of the frame portion, and the four external connection terminals are spaced from an opening end of the recess with an electrode-absent region interposed therebetween, and the four external connection terminals each have a plurality of angular parts in plan view, and at least one of the plurality of angular parts is in proximity to the inner peripheral edge of the frame portion in the arc shape or the chamfered shape at each of the four corners thereof.

According to the invention, the four corners on the inner peripheral edge of the frame portion of the insulated container are arc-shaped or chamfered. This may impart an additional strength to the four corners of the frame portion to improve the frame portion in rigidity, making the insulated container more resistant to deflection under various stresses imposed thereon by the external substrate and the like. Then, at least one of the angular parts in each of the respective external connection terminals is in proximity to the inner peripheral edge of the frame portion in the arc or chamfered shape improved in strength at each of the corners thereof. This structural feature may advantageously alleviate the concentration of stresses on the angular parts, thereby effectively suppressing the occurrence of solder cracks.

According to the invention, the external connection terminals are formed at the four corners on the bottom surface of the frame portion with the electrode-absent region interposed between these external connection terminals and the opening end of the recess in which the electronic component is housed. This structural feature may advantageously prevent the dissolved solder from flowing out into the recess when the crystal device is mounted on the external substrate. This advantage may be useful and effective even with microminiaturized piezoelectric devices.

According to an aspect of the invention, the external connection terminals each have an L-like shape in plan view in which the external connection terminal is extending in different lengths in the long-side direction and the short-side direction of the outer peripheral edge of the frame portion.

According to this aspect, because one of the plurality of angular parts in each of the external connection terminals is proximate to the inner peripheral edge of the frame portion in the arc or chamfered shape at each of the corners thereof, the external connection terminal, even if its length of extension is shortened in one of the long-side direction and the short-side direction, may be instead extended longer in the other one of the directions. This may secure a sufficiently large area for the external connection terminals.

According to a preferred aspect of the invention, the one of the plurality of angular parts is situated in a proximate region or a peripheral region around the proximate region, the proximate region being defined by the inner peripheral edge of the frame portion in the arc shape or the chamfered shape at each of the four corners thereof, a first virtual straight line extending in the short-side direction along one side of the inner peripheral edge of the frame portion, and a second virtual straight line extending in the long-side direction along a side orthogonal to the one side of the inner peripheral edge of the frame portion.

According to this aspect, one of the plurality of angular parts in each of the external connection terminals is situated in the proximate region defined by the inner peripheral edge of the frame portion in the arc shape or the chamfered shape at each of the four corners thereof, a first virtual straight line extending in the short-side direction along one side of the inner peripheral edge of the frame portion, and a second virtual straight line extending in the long-side direction along a side orthogonal to the one side of the inner peripheral edge of the frame portion, or may be situated in the peripheral region around the proximate region. Then, one of the angular parts is accordingly proximate to the inner peripheral edge of the frame portion in the arc or chamfered shape improved in strength at each of the corners thereof. This may alleviate the concentration of stresses on the angular parts, thereby effectively suppressing the occurrence of solder cracks.

According to a further aspect of the invention, the peripheral region is a region relatively close to the proximate region and defined by a displaced first virtual straight line that is the first virtual straight line parallelly displaced by a first distance outward relative to the proximate region and a displaced second virtual straight line that is the second virtual straight line parallelly displaced by a second distance outward relative to the proximate region, the region further being defined by the displaced first and second virtual straight lines and third and fourth virtual straight lines orthogonal to the first and second virtual straight lines at arc or chamfer ending positions on the inner peripheral edge of the frame portion in the arc shape or the chamfered shape at each of the corners thereof, the first distance is equal to or less than one-fourth of a frame width of a part of the frame portion extending in the short-side direction, and the second distance is equal to or less than one-fourth of a frame width of a part of the frame portion extending in the long-side direction.

According to this aspect, the peripheral region is such a region that the proximate region is broadened outward by one-fourth or less of the width of the frame portion. The peripheral region is accordingly proximate to the arc-shaped or chamfered inner peripheral edge of the frame portion improved in strength. Then, one of the angular parts of the external connection terminal is situated in the peripheral region in proximity to the arc-shaped or chamfered inner peripheral edge of the frame portion improved in strength. This may alleviate the concentration of stresses on the angular parts, thereby effectively suppressing the occurrence of solder cracks.

According to a further aspect of the invention, the one of the plurality of angular parts is situated in the proximate region.

This aspect, wherein one of the angular parts of each external connection terminals is situated in the proximate region, may succeed in further decentralizing stresses prone to be localized on the angular parts, thereby effectively suppressing the occurrence of solder cracks.

According to an aspect of the invention, in the external connection terminals extending from the four corners on the bottom surface of the frame portion in the long-side direction and the short-side direction, ends of the external connection terminals are extending in the long-side direction and the short-side direction farther than the first virtual straight line and the second virtual straight line.

According to this aspect, in the external connection terminals extending from the four corners on the bottom surface of the frame portion in the long-side direction and the short-side direction, their ends are extending in these directions farther than the first virtual straight line and the second virtual straight line along the respective sides of the inner peripheral edge of the frame portion. This may advantageously secure even a larger area for the external connection terminals, ensuring an enough boding strength between the external substrate and solder. This advantage may be useful and effective even with microminiaturized piezoelectric devices.

According to a further aspect of the invention, lengths of extension of the external connection terminals extending in the short-side direction from the four corners on the bottom surface of the frame portion are larger than lengths of extension of the external connection terminals extending in the long-side direction from the four corners on the bottom surface of the frame portion, and the one of the plurality of angular parts is an angular part of an end of the external connection terminal extending in the long-side direction.

According to this aspect, among the extending ends of the external connection terminal extending in the long-side direction and the short-side direction of the frame portion, an angular part at the extending end close to each corner on the inner peripheral edge of the frame portion may be proximate to the arc-shaped or chamfered inner peripheral edge improved in strength as one angular part.

According to an aspect of the invention, the electronic component has a cuboidal shape and is housed in the recess in a manner that a longitudinal direction of the electronic component is orthogonal to the long-side direction of the frame portion.

According to this aspect, the cuboidal electronic component is disposed with its longitudinal direction orthogonal to the long-side direction of the frame portion where deflection is more likely to occur. The frame portion rectangular in plan view, if subject to the stresses from the external substrate, has a larger degree of deflection in the long-side direction than in the short-side direction. Comparing this structural feature to the electronic component disposed with its longitudinal direction parallel to the long-side direction, the degree of deflection of the frame portion may be more effectively suppressed. This may help to lessen the bending stress that may act on the electronic component.

According to a preferred aspect of the invention, the four corners on the inner peripheral edge of the frame portion have an arc shape in plan view, the external connection terminals each have an inner peripheral edge having an arc shape substantially corresponding to the arc shape at each of the corners on the inner peripheral edge of the frame portion, and there is a displacement in the long-side direction between a center of the arc shape on the inner peripheral edge in each of the external connection terminals and a center of the arc shape at each of the corners on the inner peripheral edge of the frame portion.

According to this aspect, the inner peripheral edges of the external connection terminals are so arc-shaped as to substantially correspond in shape to the arc-shaped four corners on the inner peripheral edge of the frame portion, and the centers of the arc shape on the inner peripheral edge of each external connection terminal and the arc shape on the inner peripheral edge of the frame portion are displaced from each other in the long-side direction. The four corners on the inner peripheral edge of the frame portion are arc-shaped in plan view, so that the frame portion is increased in rigidity and less likely to deflect. Then, the arc shape at each corner on the inner peripheral edge of the frame portion improved in strength and the arc shape on the inner peripheral edge of each external connection terminal are shaped substantially alike and displaced from each other in the long-side direction. This structural feature may advantageously alleviate stresses transmitted from the frame portion to the external connection terminals.

This aspect may advantageously further reduce the risk that the dissolved solder may flow out into the recess when the crystal device is mounted on the external substrate. This advantage may be useful and effective even with microminiaturized piezoelectric devices rectangular in plan view. The centers of the arc shape on the inner peripheral edge of each external connection terminal and the arc shape on the inner peripheral edge of the frame portion are displaced from each other in the long-side direction of the outer peripheral edge of the frame portion. This may secure an area for the electrode-absent region in the longitudinal direction where enough space is more easily available. That is to say, a larger interval in the long-side direction may be securable between the inner peripheral edge of the external connection terminal and the inner peripheral edge of the frame portion, i.e., the opening end of the recess.

According to a further aspect of the invention, a curvature radius of the arc shape on the inner peripheral edge in each of the external connection terminals and a curvature radius of the arc shape at each of the corners on the inner peripheral edge of the frame portion are substantially equal.

According to this aspect wherein the two arc curvature radii are equal, the arc shape on the inner peripheral edge in each of the external connection terminals and the arc shape at each corner on the bottom surface of the frame portion become more alike. This structural feature may advantageously alleviate stresses transmitted from the insulated container to the external connection terminals.

Effect of the Invention

This invention, by way of the structural and technical features described thus far, provides a piezoelectric device advantageous in that the microminiaturization of crystal devices may be well-addressed, the likelihood of solder cracks may be reducible, and higher bonding reliability may be attainable.

BRIEF DESCRIPTION OF THE DRAWINGS

FIG. 10 is a plan view of a symmetric external connection terminal used in the stress simulation test performed.

FIG. 11 is a plan view of an asymmetric external connection terminal used in the stress simulation test performed.

EMBODIMENTS OF THE INVENTION

Hereinafter, embodiments of the invention are described in detail referring to the accompanying drawings by way of, as an example of piezoelectric devices, a surface mount crystal unit with a built-in temperature sensor.

Figure 1:
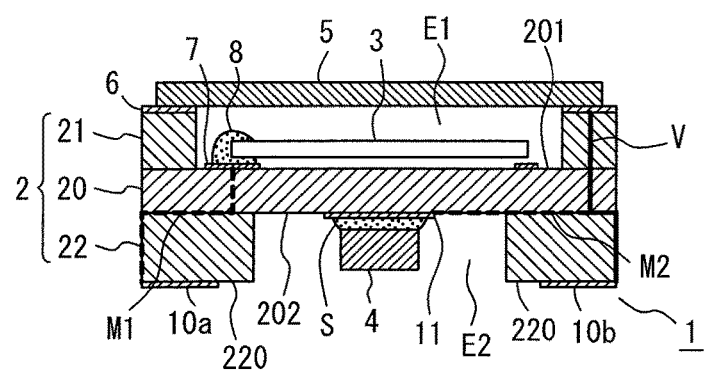
FIG. 1 is a schematic sectional view of a crystal unit according to an embodiment of the invention.
Figure 2:
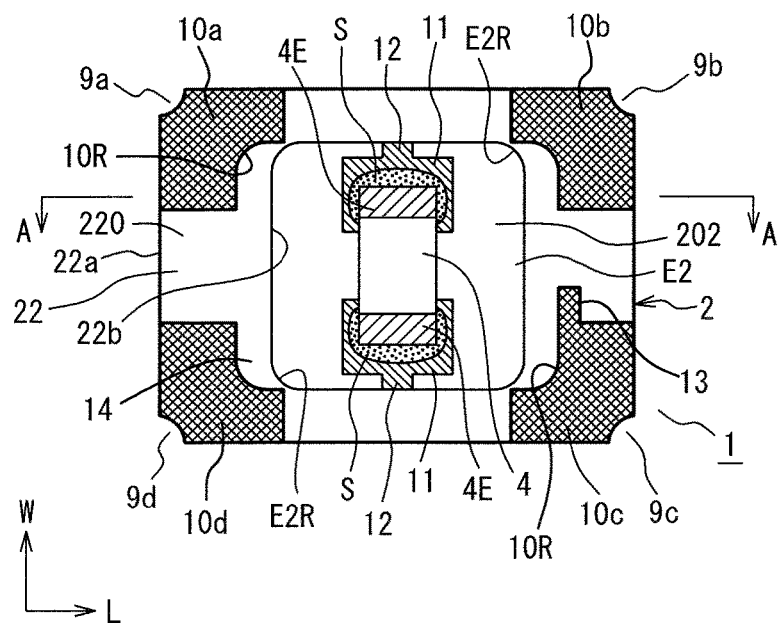
FIG. 2 is a schematic bottom view of the crystal unit according to the embodiment.
Figure 3:
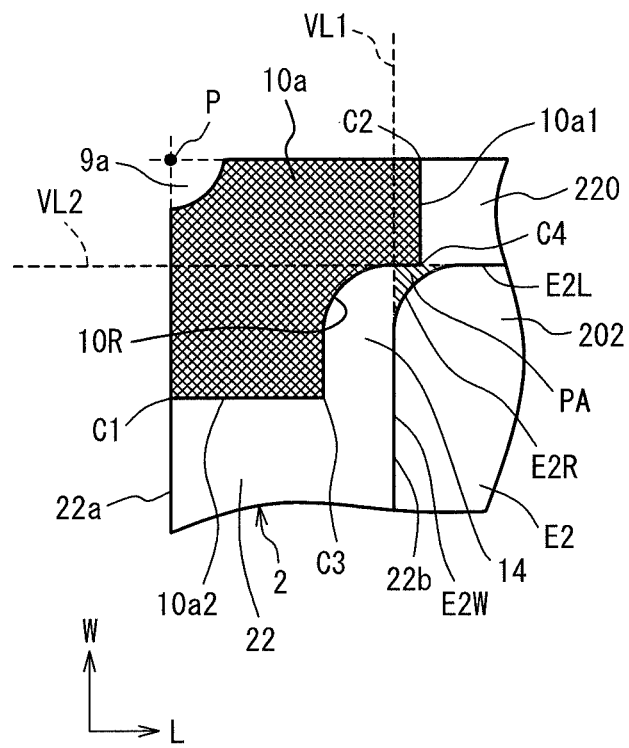
FIG. 3 is an enlarged view of FIG. 2.

An embodiment of the invention is described referring to FIGS. 1 to 3. FIG. 2 is a schematic bottom view of a crystal unit according to an embodiment of the invention. FIG. 1 is a schematic sectional view of the illustration of FIG. 2 taken along A-A line. FIG. 3 is a schematic enlarged view of a region including an external connection terminal 10a illustrated in FIG. 2.

Referring to FIG. 1, a crystal unit 1 with a built-in temperature sensor (hereinafter, "crystal unit 1") is a substantially cuboidal package which is rectangular in plan view. According to this embodiment, the crystal unit 1, in plan view, has outside dimensions of 1.6 mm on long side×1.2 mm on short side, and its oscillation frequency is 38.4 MHz. These outside dimensions and oscillation frequency of the crystal unit 1 are non-limiting examples, and the invention may be applicable to crystal units sized differently and having different oscillation frequencies.

The principal structural elements of the crystal unit 1 are an insulated container 2 (hereinafter, "base 2"), a crystal element 3, an electronic component 4, and a lid 5. The electronic component according to this embodiment is a thermistor which is a kind of temperature sensor (hereinafter, "thermistor 4"). The crystal unit 1 is temperature-compensated externally based on temperature-related information obtained from the thermistor 4. The structural elements of the crystal unit 1 are schematically described.

As illustrated in FIGS. 1 and 2, the base 2 is a rectangular container in plan view made of an insulating material. The base 2 has a plate-shaped substrate portion 20, an upper frame 21 extending upward from an outer peripheral part of a main surface 201 of the substrate portion 20, and a lower frame 22 extending downward from an outer peripheral part of another main surface 202 of the substrate portion 20. The main surface 202 of the substrate portion 20 is a surface that faces an external substrate. The main surface 201 of the substrate portion 20 is a surface opposite to the main surface mounted with the electronic component, thermistor 4. According to this embodiment, the substrate portion 20, upper frame, and lower frame 22 are each a ceramic green sheet (alumina). These three sheets are stacked on one another and sintered to be integrally molded. Among the layered sheets are routed internal wirings in a predetermined shape.

As illustrated in FIG. 1, a space defined by the upper frame 21 of the base 2 and the main surface 201 of the substrate portion 20 is an upper recess E1. The upper recess E1 has a substantially rectangular shape in plan view. The upper frame 21 surrounding the upper recess E1 has an inner peripheral edge substantially rectangular in plan view, and four corners on the inner peripheral edge have an arc shape in plan view. A pair of crystal mounting pads 7 is juxtaposed on one end side of an inner bottom surface of the upper recess E1 (FIG. 1 illustrates only one crystal mounting pad 7). One end side of the crystal element 3 is conductively joined to the crystal mounting pads 7 with an electroconductive adhesive 8.

A space defined by the lower frame 22 of the base 2 and the main surface 202 of the substrate portion 20 is a lower recess E2. The lower recess E2, in plan view, has a square shape and is smaller in size than the upper recess E1. As for a positional relationship between these recesses in perspective plan view, the lower recess E2 is contained in the upper recess E1.

As illustrated in FIG. 2, an outer peripheral edge 22a of the lower frame 22 according to this embodiment is rectangular in plan view. The outer peripheral edge 22a has a shape substantially corresponding to the outer shape of the base 2 in plan view. An inner peripheral edge 22b of the lower frame 22, i.e., an opening end of the lower recess E2, is square in plan view. Two each of four sides of the lower recess E2 forming the opening end are substantially parallel, respectively, to short sides of the outer peripheral edge 22a of the lower frame 22 (sides parallel to a direction illustrated with a reference symbol W in FIG. 2) and long sides of the outer peripheral edge 22a of the lower frame 22 (sides parallel to a direction illustrated with the symbol L in FIG. 2). Four corners on the inner peripheral edge 22b of the lower frame 22 have an arc shape E2R in plan view. The four corners on the inner peripheral edge 22b of the lower frame 22 each have such a shape in plan view that an angular part of the lower recess E2 square in plan view is rounded in an arc shape (one-quarter portion of a circle).

As illustrated in FIG. 2, notches 9a, 9b, 9c, and 9d are formed at four angular parts on the outer peripheral edge 22a of the lower frame 22 rectangular in plan view. These notches 9a, 9b, 9c and 9d are formed so as to vertically penetrate through the lower frame 22 alone on four ridges of an outer surface of the base 2. In plan view, the four notches 9a, 9b, 9c, and 9d have the shape of a one-quarter portion of a circle, and conductors are adhered to inner wall surfaces of these notches. The conductors are connected respectively to external connection terminals 10a, 10b, 10c, and 10d which will be described later.

As illustrated in FIG. 2, a pair of thermistor mounting pads 11 to be conductively joined to the thermistor 4 is formed facing each other on the main surface 202 of the substrate portion 20. These paired thermistor mounting pads 11 are connected to extraction electrodes 12 provided in a pair. The paired extraction electrodes 12 are electrically connected respectively to the external connection terminals 10b and 10d for thermistor through the internal wiring. The paired thermistor mounting pads 11 are conductively joined with a solder S to electrodes 4E at both ends of the thermistor 4. The solder S used in this embodiment is a lead-free solder not containing lead (Pb).

According to this embodiment, the paired thermistor mounting pads 11 are disposed so as to face each other in the short-side direction of the outer peripheral edge 22a of the lower frame 22. That is to say, the thermistor 4 is conductively joined to the surfaces of the thermistor mounting pads 11 in a manner that the longitudinal direction of the thermistor 4 substantially cuboidal, which is described later, is orthogonal to the long sides of the outer peripheral edge 22a of the lower frame, i.e., the long sides of the base 2. Mounting the thermistor 4 on the pads so as to meet this positional relationship may advantageously alleviate stresses that may act on the thermistor 4 when the crystal unit 1 is mounted on the external substrate. The mechanism of this effect is described below.

The external substrate mounted with the crystal unit 1 may be deflected by the action of bending stress. In case the external substrate is deflected, the bending stress may be transmitted to the crystal unit 1 solder-bonded to the external substrate. The base 2, because of its rectangular shape in plan view, has a larger degree of deflection on its long sides than short sides. Taking this fact into account, the substantially cuboidal thermistor 4 is joined to the pads in the lower recess E2 with its longitudinal direction orthogonal to the long sides of the base 2 where deflection is more likely to occur. In this manner, the thermistor 4 can be fixedly joined to the pads in the direction where the base 2 is less deflectable. As compared to joining the thermistor 4 to the pads in the lower recess E2 with its longitudinal direction parallel to the long sides of the base 2. As a result, the bending stress and/or other possible stresses that may act on the thermistor 4 may be alleviated.

Assuming that the upper frame 21 and the lower frame 22 are substantially equal in width, the base 2 including the upper frame 21, substrate portion 20, and lower frame 22 may be a package in the shape of an alphabet "H" (H-type package) with the recesses E1 and E2 formed on the upper and lower sides of the substrate portion 20. In this package structure, the crystal element 3 and the thermistor 4 are housed in difference spaces; upper and lower recesses E1 and E2. This structure may advantageously mitigate possible adverse impacts from gases generated during the production and noises from the other elements. Yet, the crystal element 3 and the thermistor 4 are housed in the same base 2 in proximity to each other. The proximity between these elements may reduce discrepancy between the actual temperature of the crystal element 3 and the measured temperature of the thermistor 4. Further advantageously, the crystal unit 1 with a built-in temperature sensor according to this embodiment is a temperature uncompensated device with no temperature-compensating circuit installed therein. In the crystal device of this type, favorable phase noise characteristics may be attainable.

As illustrated in FIG. 1, a metal film 6 is formed on the upper surface of the upper frame 21 of the base 2. This metal film 6 and a sealing material formed on the lid 5, described later, are heated in contact with each other, so that the lid 5 and the base 2 are welded to each other. The metal film 6 according to this embodiment is a gold-plated layer (Au). This is, however, a non-limiting example, and one selected from other metals may be usable.

Referring to FIG. 1, the crystal element 3 is a piezoelectric element rectangular in plan view in which various electrodes are formed on front and back surfaces of an AT-cut crystal plate. Though not illustrated in FIG. 1, in a substantially central part of the crystal element, a pair of driving electrodes are formed on front and back surfaces thereof in an opposed manner. From these paired driving electrodes are extracted extraction electrodes toward short-side edges on front and back main surfaces of the crystal element 3. The terminal ends of the extraction electrodes serve as electrodes for joining purpose. The crystal element 3 is joined being supported in a cantilever manner by the crystal mounting pads 7 and electroconductive adhesive 8. The electroconductive adhesive 8 according to this embodiment is a silicone-based adhesive, however, the electroconductive adhesive 8 may be one selected from other conductive adhesives.

As said earlier, the temperature sensor according to this embodiment is the thermistor 4. The thermistor 4 is an NTC thermistor (Negative Temperature Coefficient Thermistor) characterized by a lower resistance value with an increase in temperature. This embodiment employs a chip thermistor suitably for the microminiaturized piezoelectric device. Referring to FIG. 2, the thermistor 4 has a substantially cuboidal shape in the size of 0.6 mm×0.3 mm in plan view. The thermistor size illustrated in this embodiment is, however, just a non-limiting example, and a thermistor sized differently may be usable instead.

As illustrated in FIG. 1. the lid 5 is a flat plate rectangular in plan view. The base material of the lid 5 is kovar, and its surfaces are plated with nickel and gold. A gold-tin alloy (AuSn) formed in the shape of a frame is provided as a sealing material in an outer peripheral part of a main surface of the lid 5 to be joined to the base 2. The sealing material may be selected from other materials instead of the gold-tin alloy.

According to this embodiment, a conductor-filled via V is penetrating through the upper frame 21 and the substrate portion 20. One end of this via V is exposed on the upper surface of the upper frame 21 and electrically connected to the metal film 6. The other end of the via V is connected to the internal wiring of the base 2 and further connected to the external connection terminal 10*d* through the internal wiring. This provides for ground connection between the metal-made lid 5 and the external connection terminal 10*d*, and an electromagnetic shield effect may be exerted by way of the ground connection. Thus far, the structural elements were schematically described.

Next, the external connection terminals are described referring to FIGS. 2 and 3.

As illustrated in FIG. 2, a bottom surface 220 of the lower frame 22, i.e., an outer peripheral edge of the bottom surface of the base 2, has a rectangular shape in plan view. The external connection terminals 10*a*, 10*b*, 10*c*, and 10*d* are formed at four corners on the bottom surface 220. These four external connection terminals 10*a*, 10*b*, 10*c*, and 10*d* are solder-bonded to the external substrate. According to this embodiment, the external connection terminals 10*a* to 10*d* have a multilayered structure in which three metal layers are stacked on one another. More specifically, the external connection terminals 10*a*, 10*b*, 10*c*, and 10*d* each have a structure in which a molybdenum layer is formed by printing on the base material (ceramic) of the base 2, and a nickel-plated layer and a gold-plated layer are deposited on the molybdenum layer. The nickel-plated layer and the gold-plated layer are formed by electroplating. The external connection terminals 10*a*, 10*b*, 10*c*, and 10*d* and the pads are collectively formed at once. These metals are exemplified materials of the layers constituting the external connection terminals 10*a*, 10*b*, 10*c*, and 10*d*, and other metals may be usable. For example, tungsten may be used instead of molybdenum.

Of the four external connection terminals 10*a*, 10*b*, 10*c*, and 10*d*, the external connection terminals 10*a* and 10*c* are electrically connected to the driving electrodes, not illustrated in the drawings, formed on the front and back surfaces of the crystal element 3. The other external connection terminals 10*b* and 10*d* are electrically connected to the electrodes 4E at both ends of the thermistor 4. The external connection terminals 10*a* and 10*c* are the terminals for the crystal element, while the external connection terminals 10*b* and 10*d* are the terminals for the thermistor. No electrical connection is present between the external connection terminals 10*a* and 10*c* for the crystal element and the external connection terminals 10b and 10d for the thermistor. As illustrated with internal wirings M1 and M2 in FIG. 1, the external connection terminals 10a and 10c, and 10b and 10d are isolated from each other. That is to say, the external connection terminals 10a and 10c are electrically connected to the driving electrodes of the crystal element 3 alone, whereas the external connection terminals 10b and 10d are electrically connected to the electrodes 4E at both ends of the thermistor 4 alone.

The four external connection terminals 10a, 10b, 10c, and 10d are, in plan view, longer in the short-side direction of the outer peripheral edge 22a of the lower frame 22 (up-down direction in FIG. 2), i.e., the short-side direction of the base 2, and shorter in the long-side direction of the outer peripheral edge 22a of the lower frame 22 (left-right direction in FIG. 2), i.e., the long-side direction of the base 2. The external connection terminals have a shape with a bent portion, like an alphabet "L", shorter in the long-side direction of the base 2. An inner peripheral edge side of the bent portion has an arc shape 10R.

As said earlier, the base 2 rectangular in plan view has a larger degree of deflection on its long sides than short sides, and the deflection of the base has its peak value at the central part in the long-side direction. Therefore, the ends of the external connection terminals 10a, 10b, 10c, and 10d should preferably not be overly lengthened in the long-side direction of the base. To secure an enough space for solder bonding, the ends of the external connection terminals 10a, 10b, 10c, and 10d are preferably lengthened in the short-side direction of the base.

Figure 4:
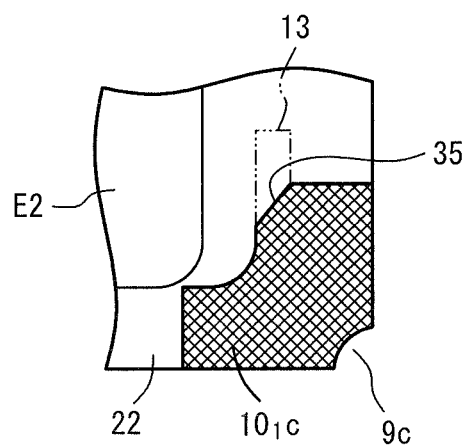
FIG. 4 is a partly enlarged view of another exemplified external connection terminal of the crystal unit illustrated in FIG. 2.

Among the four external connection terminals 10a, 10b, 10c, and 10d, the external connection terminal 10c alone has a protrusion 13 as illustrated in FIG. 2. This protrusion 13 is formed such that an end of this external connection terminal extending in the short-side direction of the outer peripheral edge 22a of the lower frame 22 is partly further extended toward the center in the short-side direction (upper side in FIG. 2). The protrusion 13 serves as a landmark used in image recognition to identify the orientations of the four external connection terminals 10a, 10b, 10c, and 10d. As illustrated in FIG. 4, a notch 35, instead of the protrusion 13, may be formed by chamfering an angular part of an external connection terminal $10_{1c}$.

The external connection terminals 10a to 10d are spaced from the inner peripheral edge 22b of the lower frame 22, i.e., the opening end of the lower recess E2, with an electrode-absent region 14 interposed therebetween. The "electrode-absent region" refers to a region on the bottom surface 220 of the lower frame 22 where the external connection terminals 10a, 10b, 10c, and 10d are not formed. In this region, ceramic used as the base material of the base 2 is exposed. By interposing the electrode-absent region 14 between the external connection terminals 10a to 10d and the opening end of the lower recess E2, the dissolved solder may be prevented from flowing out into the lower recess E2 when the crystal element 1 is mounted on the external substrate.

Next, the external connection terminal 10a is described as a typical example of the external connection terminals 10a, 10b, 10c, and 10d. It should be understood that the other external connection terminals 10b, 10c, and 10d are structured alike.

As illustrated in FIG. 3, the external connection terminal 10a has a plurality of angular parts C1, C2, C3, and C4 bent at a substantially right angle in plan view. Of these angular parts C1, C2, C3, and C4, C1 and C2 refer to the angular parts on the outer peripheral edge side of the external connection terminal 10a, while C3 and C4 refer to the angular parts on the inner peripheral edge side of the external connection terminal 10a.

According to this embodiment, of the angular parts C3 and C4 on the inner peripheral edge of the external connection terminal 10a, the angular part C4 is in proximity to the inner peripheral edge 22b having the arc shape E2R at a corner of the lower frame 22. Optionally, the angular parts C1, C2, C3, and C4 of the external connection terminal 10a may be slightly curved with a small curvature.

By bringing the angular part C4 of the external connection terminal 10a into proximity to the inner peripheral edge 22b having the arc shape E2R at a corner of the lower frame 22, the occurrence of solder cracks may be suppressed in the microminiaturized crystal unit. Because the four corners on the inner peripheral edge 22b of the lower frame 22 have the arc shape E2R in plan view, the corners may improve in strength, increasing the rigidity of the lower frame 22. By forming the four corners on the inner peripheral edge 22b of the lower frame 22 in the arc shape E2R in plan view, the lower frame 22 may increase in rigidity. As a result, different stresses generated by the external substrate and the like may be difficult to be transmitted to the base 2.

Then, at least one angular part C4 of the external connection terminal is brought into proximity to the inner peripheral edge 22b of the lower frame 22 in the arc shape E2R improved in strength. This may alleviate the concentration of stresses on the angular part C4 of the external connection terminal 10a, effectively suppressing the occurrence of solder cracks.

Figure 5:
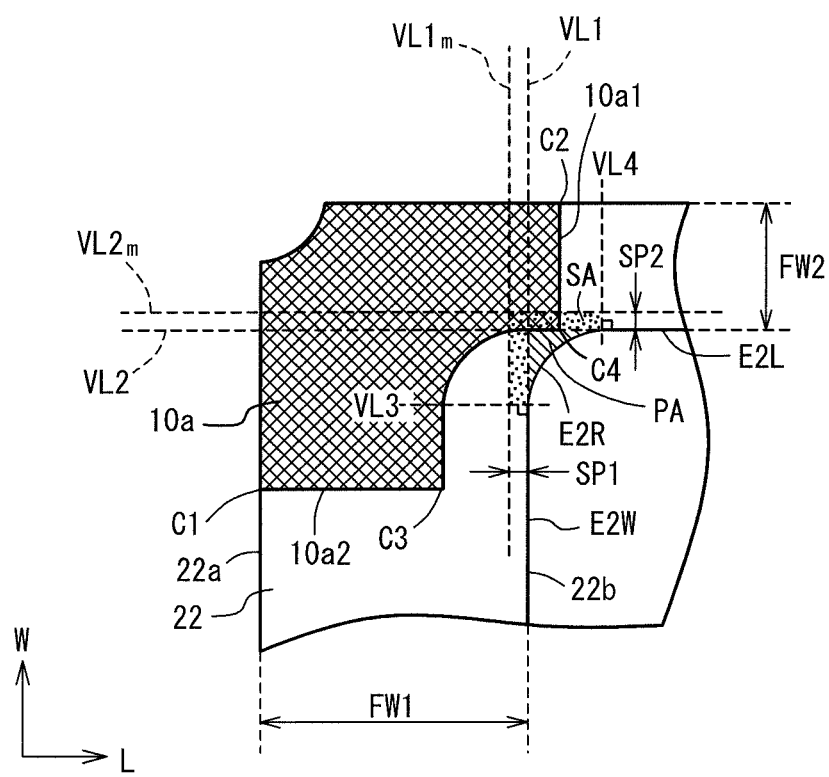
FIG. 5 is an enlarged view of FIG. 3.

The term, "proximity", is hereinafter described referring to FIG. 5 illustrating the enlarged view of FIG. 3. Taking the angular part C4 for instance, the proximity means that the angular part C4 is situated in a proximate region PA defined by the inner peripheral edge 22b having the arc shape E2R at a corner of the lower frame 22, a first virtual straight line VL1 extending along a side E2W of a pair of opposing sides that forms the opening end square in plan view of the lower recess E2, and a second virtual straight line VL2 extending along a side E2L of another pair of opposing sides that forms the opening end square in plan view of the lower recess E2, or means that the angular part C4 is situated in a peripheral region SA around the proximate region PA. In summary, the proximity refers to the presence of the angular part C4 in a region in which the combined proximate region PA and peripheral region SA are combined (PA+SA).

The first virtual straight line VL1 is extending in the short-side direction of the outer peripheral edge 22a of the lower frame 22 (up-down direction in FIG. 5). The second virtual straight line VL2 is extending in the long-side direction of the outer peripheral edge 22a of the lower frame 22 (left-right direction in FIG. 5).

The peripheral region SA around the proximate region PA is a region relatively close to the proximate region PA and defined by a displaced first virtual straight line VL1m that is the first virtual straight line VL1 defining the proximate region PA which has been parallelly displaced by a first distance SP1 outward relative to the proximate region PA (left side in FIG. 5) and a displaced second virtual straight line VL2m that is the second virtual straight line VL2 defining the proximate region PA which has been parallelly displaced by a second distance SP2 outward relative to the proximate region PA (upper side in FIG. 5). The peripheral region SA is further a region defined by the displaced first and second virtual straight lines VL1m and VL2m and third and fourth virtual straight lines VL3 and VL4 orthogonal to the first and second virtual straight lines VL1 and VL2 at are shape E2R ending positions on the lower frame 22.

The first and second distance SP1 and SP2 for defining the peripheral region SA are, with regard to the displaced first virtual straight line VL1$m$, equal to or less than one-fourth of a frame width FW1 of a part of the lower frame 22 extending in the short-side direction of the outer peripheral edge 22$a$ thereof (up-down direction in FIG. 5). The first and second distance SP1 and SP2 in this regard are preferably equal to or less than one-eighth and further preferably equal to or less than one-sixteenth of the frame width. Further, the first and second distance SP1 and SP are, with regard to the displaced second virtual straight line VL2$m$, equal to or less than one-fourth of a frame width FW2 of a part of the lower frame 22 extending in the long-side direction of the outer peripheral edge 22$a$ thereof (left-right direction in FIG. 5). The first and second distance SP1 and SP2 in this regard are preferably equal to or less than one-eighth and further preferably equal to or less than one-sixteenth of the frame width. The first and second distance SP1 and SP2 for defining the peripheral region SA should not be larger than one-fourth of the frame widths FW1 and FW2 of the lower frame 22. Otherwise, the angular part C4 of the external connection terminals may be too distant from the inner peripheral edge 22$b$ of the lower frame 22 in the are shape E2R improved in strength to alleviate the concentration of stresses on the angular part C4. In addition to this problem, in case the first and second distance SP1 and SP2 for defining the peripheral region SA are larger than one-fourth of the frame widths FW1 and FW2 of the lower frame 22, an available area for the external connection terminals may be proportionately smaller than expected, failing to attain a sufficient bonding strength to the external substrate.

The first and second distance SP1 and SP2 may be preferably decided with an eye to possible displacement of a position at which the metalized layer of the external connection terminal 10 (molybdenum layer according to this embodiment) is printed.

According to this embodiment, the angular part C4 of the external connection terminal 10$a$ lies on the second virtual straight line VL2 defining the proximate region PA as illustrated in FIGS. 3 and 5.

In the external connection terminal 10$a$, an extending end 10$a$1 is extending from a corner of the lower frame 22 in the long-side direction (left-right direction in FIG. 5) farther than the first virtual straight line VL1, and an extending end 10$a$2 is extending from the corner of the lower frame 22 in the short-side direction (up-down direction in FIG. 5) farther than the first virtual straight line VL2.

The extending ends 10$a$1 and 10$a$2 of the external connection terminal 10$a$ are respectively extending in the long-side direction and the short-side direction farther than the first and virtual straight lines VL1 and VL2 along the sides E2W and E2L of the opening end of the lower recess E2 until they reach positions more inward than the opening end of the lower recess E2. This may secure a larger area for the external connection terminal 10$a$, ensuring a required solder-bonding strength to the external substrate in the micro-miniaturized crystal unit 1.

Figure 6:
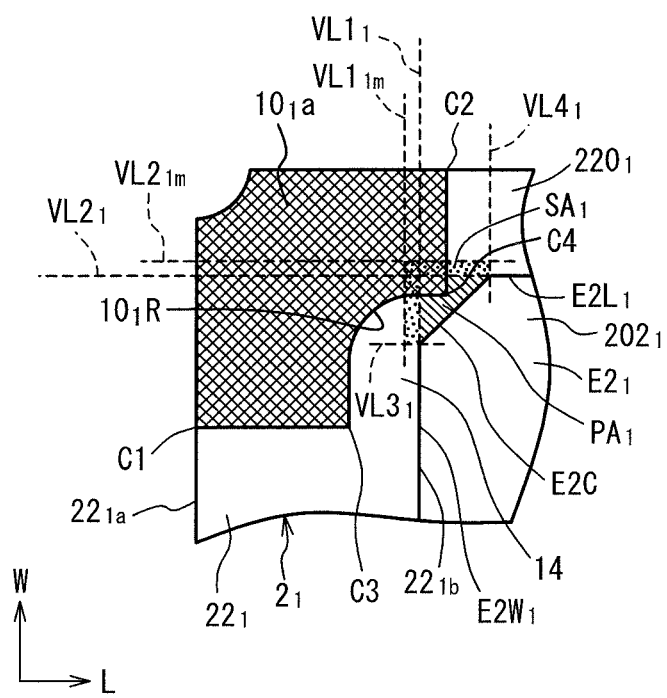
FIG. 6 is a partly enlarged bottom view of a crystal unit according to a modified example of the embodiment.

According to this embodiment, the four corners on the inner peripheral edge 22$b$ of the lower frame 22 are arc-shaped in plan view. As in a modified example of the embodiment illustrated in FIG. 6, the corners may have a linearly chamfered shape (generally called C shape) in plan view. FIG. 6 is a partly enlarged view of the external connection terminal 10$a$ illustrated as a typical example of the four external connection terminals 10$a$ to 10$d$. The same structural elements as described so far in the embodiment are identifiable with the same reference symbols, and description of such structural elements is omitted.

According to this modified example, four corners on an inner peripheral edge $22_{1b}$ of a lower frame $22_1$ in a base $2_1$ have a chamfered shape E2C in plan view.

According to this modified example, a proximate region $PA_1$ is a region defined by the inner peripheral edge $22_1$-b having the chamfered shape E2C at a corner of the lower frame $22_1$, a first virtual straight line $VL1_1$ extending along a side $E2W_1$ of a pair of opposing sides that forms the opening end square in plan view of the lower recess $E2_1$, and a second virtual straight line $VL2_1$ extending along a side $E2L_1$ of another pair of opposing sides that forms the opening end square in plan view of the lower recess $E2_1$. A peripheral region $SA_1$ around the proximate region $PA_1$ is similar to the peripheral region illustrated in FIGS. 3 and 5.

The peripheral region $SA_1$ is a region relatively close to the proximate region $PA_1$ and defined by a displaced first virtual straight line $VL1_1 m$ that is the first virtual straight line $VL1_1$ which has been parallelly displaced by a first distance outward relative to the proximate region $PA_1$ (left side in FIG. 6) and a displaced second virtual straight line $VL2_1$-m that is the second virtual straight line $VL2_1$ which has been parallelly displaced by a second distance outward relative to the proximate region $PA_1$ (upper side in FIG. 6). The peripheral region $SA_1$ is further a region defined by the displaced first and second virtual straight lines $VL1_1$-m and $VL2_1$-m and third and fourth virtual straight lines $VL3_1$ and $VL4_1$ orthogonal to the first and second virtual straight lines $VL1_1$ and $VL2_1$ at positions of the lower frame $22_1$ at straight line ending positions of the chamfered shape E2C.

According to this modified example, the angular part C4 of the external connection terminal 10$a$ is situated in the proximate region $PA_1$.

Situating the angular part C4 of the external connection terminal 10$a$ in the proximate region $PA_1$ may further alleviate the concentration of stresses on the angular part C4 than in the embodiment described earlier, thereby more effectively suppressing the occurrence of solder cracks.

According to the embodiment described earlier, the external connection terminals 10$a$ to 10$d$ have an "L"-like bent shape in plan view, and the inner peripheral edges of their bent portions are arc-shaped, which is, however, a non-limiting example. Instead of the arc shape, the bent portions of the external connection terminals 10$a$ to 10$d$ may have inner peripheral edges chamfered or bent at the right angle.

An invention that differs from the invention described so far is hereinafter described.

In the description given below, a first invention refers to the invention so far described, and a second invention refers to the invention that differs from the first invention.

The second invention is applicable to the embodiment of the first invention. The second invention is hereinafter described by way of the crystal unit 1 of FIGS. 1 to 3 described in the embodiment of the first invention. A crystal unit 1 according to an embodiment of the second invention and the crystal unit 1 according to the embodiment of the first invention are structured alike. The same structural elements as those illustrated in FIGS. 1 to 3 are illustrated with the same reference symbols, and description of such structural elements is omitted.

Figure 7:
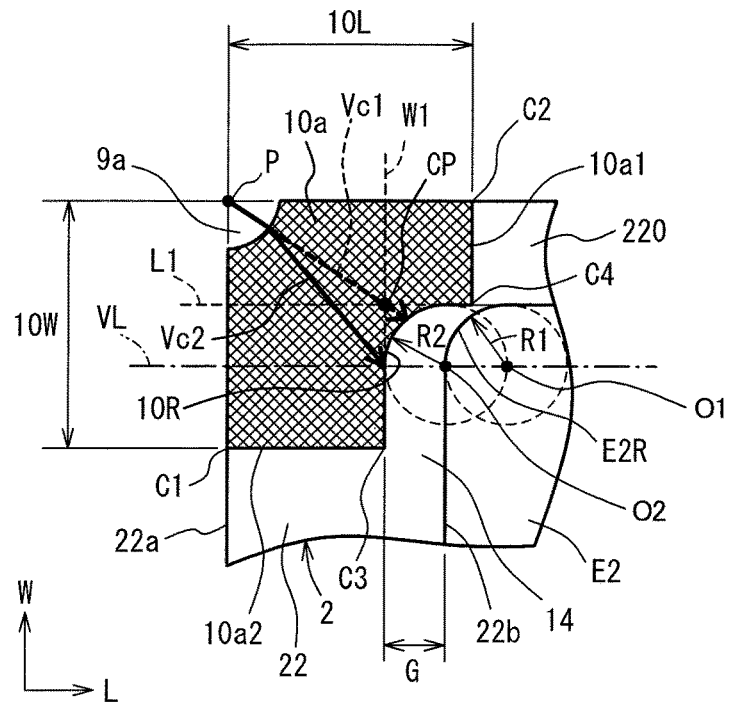
FIG. 7 is a partly enlarged view according to a further embodiment of the invention illustrated as with FIG. 3.

FIG. 7 is a drawing illustrated as with FIG. 3 to describe an embodiment of the second invention. While this drawing illustrates the external connection terminal 10$a$ as a typical example of the four external connection terminals 10$a$, 10$b$, 10c, and 10d, the other external connection terminals 10b, 10c, and 10d are structured alike.

As described in the earlier embodiment, the four corners on the inner peripheral edge 22b of the lower frame 22 have the arc shape E2R in plan view. More specifically, the four corners on the inner peripheral edge 22b of the lower frame 22 each have such a shape in plan view that an angular part of the lower recess square in plan view is rounded in an arc shape (one-quarter portion of a circle).

FIG. 7 illustrates a curvature radius of the one-quarter portion of a circle with a reference symbol R1, and its center with O1. A circle drawn with a dotted line centered on the center O1 is an imaginary complete circle of the one-quarter portions to illustrate its whole circumference.

The corners on the inner peripheral edges of the lower frame 22 each formed in the shape of one-quarter portion of a circle (arc shape) improve in strength, improving the lower frame 2 in rigidity. Then, the base 2 is less likely to deflect under the stresses generated by the external substrate and the like, thereby mitigating the stresses that may be transmitted from the base 2 to the external connection terminal 10a.

The external connection terminal 10a has an "L"-like bent shape in plan view, and the inner peripheral edge of its bent portion has the arc shape 10R. The inner peripheral edge of this bent portion of the external connection terminal 10a is a one-quarter portion of a circle in plan view. The curvature radius of the one-quarter portion of a circle is illustrated with R2, and its center with O2. A circle drawn with a dotted line centered on the center O2 is an imaginary complete circle of the one-quarter portions to illustrate its whole circumference.

According to this embodiment, the curvature radii R1 and R2 of these two arc shapes are equal.

By equating the curvature radii R1 and R2 of the two arc shapes, the inner peripheral edge in the arc shape 10R of the external connection terminal 10a and the inner peripheral edge 22b in the arc shape E2R at a corner of the lower frame 22 may be more alike in shape. This may further mitigate the stresses that may be transmitted from the base 2 to the external connection terminals 10a to 10d.

As illustrated in FIG. 7, the center O1 of the arc shape E2R on the inner peripheral edge 22b at a corner on the bottom surface 220 of the lower frame 22 and the center O2 of the arc shape 10R on the inner peripheral edge of the external connection terminal 10a are displaced from each other in the long-side direction of the outer peripheral edge 22a of the lower frame 22 (left-right direction in FIG. 7). In the example illustrated in FIG. 7, the center O1 and the center O2 lie away from each other on the same virtual straight line VL extending in the long-side direction of the outer peripheral edge 22a of the lower frame 22. According to this embodiment wherein the curvature radii R1 and R2 of the two arc shapes are equal, the two one-quarter portions of a circle are displaced from each other in the long-side direction. The centers O1 and O2 may not necessarily be on the same virtual straight line VL. The centers O1 and O2, as well as being displaced essentially in the long-side direction of the outer peripheral edge 22a of the lower frame 22, may be slightly displaced in the short-side direction of the outer peripheral edge 22a of the lower frame 22.

The two arc shapes (one-quarter portions of a circle) thus positionally related to each other serve to further mitigate the stresses that may be transmitted from the base 2 to the external connection terminals 10a to 10d, more effectively suppressing the occurrence of solder cracks. The four corners on the inner peripheral edge 22b of the lower frame 22 are formed in the arc shape E2R in plan view to improve the lower frame 22 in rigidity, thereby making the base 2 less likely to deflect. In addition to this, the arc shapes at the four corners on the inner peripheral edge 22b of the lower frame 22 improved in strength and the arc shapes on the inner peripheral edges of the external connection terminals 10 to 10d are substantially the same shape, and they are displaced in the long-side direction of the outer peripheral edge 22a of the lower frame 22, i.e., the long-side direction of the base 2. This may more effectively mitigate the stresses that may be transmitted from the base 2 to the external connection terminals 10 to 10d.

In the microminiaturized crystal unit 1 rectangular in plan view, this embodiment may reduce the risk of the dissolved solder from flowing out into the lower recess E2 when the crystal unit 1 is mounted on the external substrate. This advantage may be attainable because, by way of the displacement in the long-side direction of the base 2 between the center O2 of the arc shape 10R on the inner peripheral edge of the external connection terminal 10a and the center O1 of the arc shape at a corner on the inner peripheral edge 22b of the lower frame 22 as illustrated in FIG. 7, an area for the electrode-absent region 14 may be surely securable in the long-side direction of the base 2 where enough space is more easily available. The effect of the displacement between these centers may be rephrased such that a larger distance G may be securable in the long-side direction of the base (left-right direction in FIG. 7) between the inner peripheral side of the external connection terminal 10a and the inner peripheral edge 22b of the bottom surface 220 of the lower frame 22.

As illustrated in FIG. 7, the external connection terminal 10a having an "L"-like bent shape in plan view is extending by different lengths of extension from a corner of the lower frame 22 in two directions; the long-side direction of the outer peripheral edge 22a of the lower frame 22 (left-right direction in FIG. 7) and the short-side direction of the outer peripheral edge 22a of the lower frame 22 (up-down direction in FIG. 7). A length of side 10W representing the extension of the external connection terminal 10a in the short-side direction of the outer peripheral edge 22a of the lower frame 22 is larger than a length of side 10L representing the extension of the external connection terminal 10a in the long-side direction of the outer peripheral edge 22a of the lower frame 22 (10L<10W).

That is to say, the external connection terminal 10a is asymmetric to a virtual line, not illustrated in the drawing, which connects a virtual outermost angular part P assuming that the notch 9a does not exist to a virtual angular part CP of the bent portion on the inner peripheral side of the external connection terminal 10a. The virtual angular part CP refers to a point of intersection of virtual straight lines L1 and W1 extending along the sides on the inner peripheral side of the external connection terminal 10a.

Hereinafter is described the transmission of stresses in connection with exemplified shapes in plan view of the external connection terminal 10a. The exemplified shapes of the external connection terminal 10a are; a simple unbent rectangular shape unlike the external connection terminal 10a according to the embodiment, a symmetric shape with a bent portion, as with the external connection terminal 10a according to the embodiment, with equal lengths of extension in the long-side and short-side directions of the outer peripheral edge 22a of the lower frame 22 (10L=10W), and an asymmetric shape with different lengths of extension in the long-side and short-side directions of the outer peripheral edge 22a of the lower frame 22.

Supposing that an external connection terminal has a simple unbent rectangular shape in plan view, among four angular parts of the external connection terminal, the angular part most likely to be the origin of cracks under the stresses is the angular part farthest from a center O4 of the base bottom surface illustrated in FIG. 8 described later. Then, the cracks are prone to advance alongside the transmission of stresses from the farthest angular part to one of the four angular parts closest to the center O4 of the base bottom surface.

Supposing that an external connection terminal has a shape with a bent portion in plan view in which the external connection terminal is extending by an equal length in the long-side and short-side directions of the outer peripheral edge 22a of the lower frame 22 (10L=10W), the external connection terminal is symmetric to a virtual line which connects the virtual outermost angular part P assuming that the notch 9a does not exist to the virtual angular part CP of the bent portion on the inner peripheral side of the external connection terminal 10a. It is contemplated, in this instance, that the stresses may be transmitted from the angular part farthest from the center O4 of the base bottom surface likely to be the origin of cracks (nearby of the virtual angular part P corresponding to the farthest angular part if the notch 9a is formed there) to the virtual angular part CP as illustrated with a reference symbol Vc1 in FIG. 7.

Next is analyzed an external connection terminal with a bent portion in an asymmetric L-like shape in plan view in which, like the external connection terminal 10a according to the embodiment, the length of extension 10W in the short-side direction of the outer peripheral edge 22a of the lower frame 22 is larger than the length of extension 10L in the long-side direction of the outer peripheral edge 22a of the lower frame 22. It is contemplated, in this instance, that the transmission of stresses may be affected by the extension longer than the other (10W) and accordingly shifted downward from the virtual angular part CP as illustrated with a reference symbol Vc2 in FIG. 7

Speaking of the transmission of stresses, generally, stresses are often localized on linearly bent continuous portions (for example, angular part). In the context of decentralizing stresses, therefore, curvedly-continuous portions may be desirable.

When the stresses are transmitted with a downward shift from the virtual angular part CP as illustrated with the reference symbol Vc2 in FIG. 7 in the external connection terminal 10a asymmetric in plan view, however, the concentration of stresses on the inner peripheral edge in the arc shape 10R of the external connection terminal 10a may be difficult. This is because the inner peripheral edge in the arc shape 10R of the external connection terminal 10a also addresses the directionality of transmitted stresses. Arranging the inner peripheral edge of the external connection terminal 10a at a relatively blunt angle may alleviate the concentration of stresses originated from the angular part of the external connection terminal 10a (or virtual angular part P) farthest from the center of the base bottom surface. As a result, the occurrence of solder cracks is suppressed in the crystal unit 1 in the microminiaturized crystal unit 1 rectangular in plan view.

Figure 8:
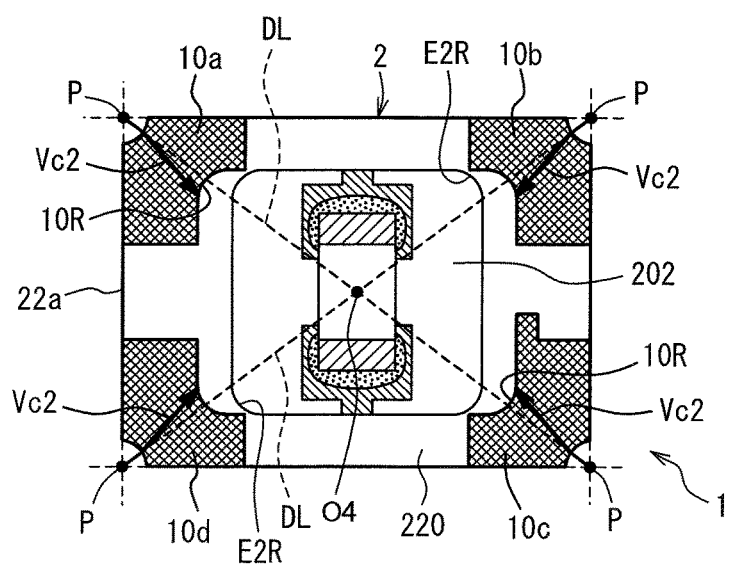
FIG. 8 is a schematic bottom view according to the embodiment of FIG. 7 illustrated as with FIG. 2.

The crystal unit according to this embodiment may advantageously retard the progression of cracks, if any, of the used solder, which is described referring to FIG. 8. FIG. 8 is a schematic bottom view of the crystal unit 1 according to this embodiment, illustrated as with FIG. 2. In FIG. 8, two virtual diagonal lines DL are each drawn with a dotted line. These virtual diagonal lines DL are straight lines each connecting two virtual angular parts diagonally opposite to each other among the four virtual angular parts P on the outer peripheral edge 22a of the bottom surface 220 of the lower frame 22 rectangular in plan view. The point of intersection of these virtual diagonal lines (center of the bottom surface of the base 2) is illustrated with a reference symbol O4.

The shapes of the four external connection terminals 10a to 10d are asymmetric to virtual lines, not illustrated in the drawing, which respectively connect the four virtual angular parts P on the outer peripheral edge 22a of the bottom surface 220 of the lower frame 22 to the virtual angular parts (not illustrated in FIG. 8) of the bent portions on the inner peripheral side of the external connection terminals 10a to 10d. As described referring to FIG. 7, it is contemplated that the transmission of stresses, under the influence of longer extensions of the external connection terminals 10a to 10d L-shaped in plan view, may be shifted in directions illustrated with the reference symbol Vc2 in FIG. 8 from the virtual angular parts P on the outer peripheral side of the external connection terminals 10a to 10d.

Describing such a shift using the two diagonal lines DL as reference lines, the four stress-transmitted directions Vc2 deviate from the diagonal lines DL, and two each of these directions approach each other in an arc shape in the short-side direction of the outer peripheral edge 22a of the lower frame 22 (up-down direction in FIG. 8). The stress-transmitted directions thus shifted may effectively retard the transmission of stresses from the virtual angular parts P farthest from the center O4 of the base bottom surface, which are likely to be the origin of cracks, toward the center O4.

Next, a stress simulation was carried out for two different shapes of the external connection terminal; asymmetric L-like shape in plan view in which the length of side 10W extending in the short-side direction of the outer peripheral edge 22a of the lower frame 22 is larger than the length of side 10L extending in the long-side direction of the outer peripheral edge 22a as described in the embodiment, and symmetric shape in which the lengths of side 10W and 10L respectively extending in the short-side and long-side directions are equal.

Figure 9:
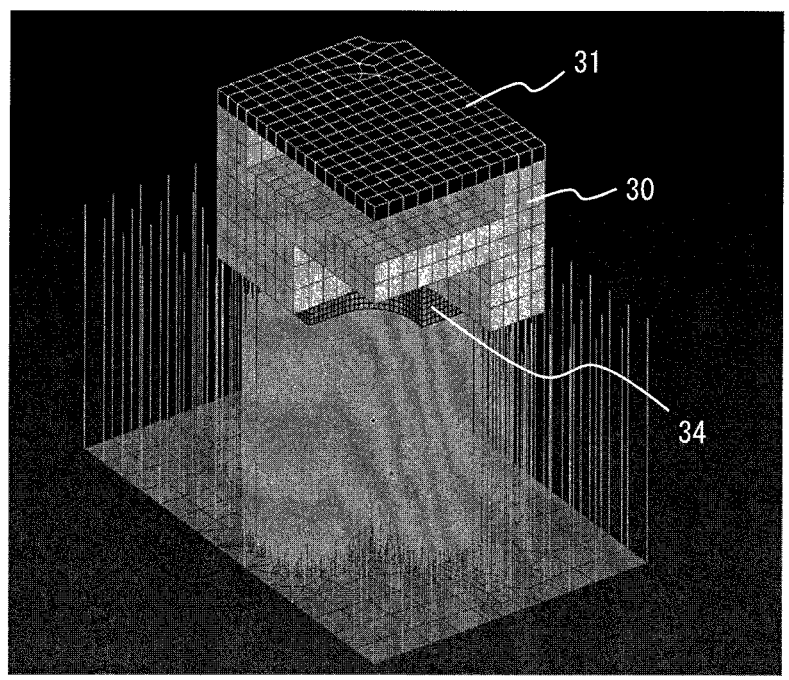
FIG. 9 is a perspective view of a stress simulation model.

As illustrated in the perspective view of FIG. 9, this stress simulation used a simulation model in which a one-quarter portion of a crystal unit was bonded with a solder 34 to an external substrate. The structural elements of this crystal unit included: a lid 31; a ceramic base 30 representing the substrate portion 20 and the upper and lower frames 21 and 22; and symmetric external connection terminals 32 illustrated in FIG. 10 or asymmetric L-shaped external connection terminals 33 illustrated in FIG. 11 which are mounted on the bottom surface of the ceramic base 30.

The ceramic base 30, lid 31, and external connection terminal 33 illustrated in FIG. 11 had the same dimensions as described in the embodiment of FIGS. 1 to 3. The external connection terminal 32 of FIG. 10 is a symmetric version of the external connection terminal 33 of FIG. 11 having a length of extension shortened in the short-side direction.

The outcome of this stress simulation is described below.

Figure 12:
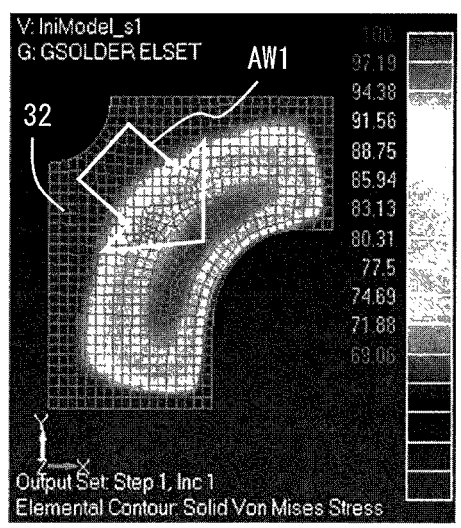
FIG. 12 is a stress distribution chart of the symmetric external connection terminal illustrated in FIG. 10.
Figure 13:
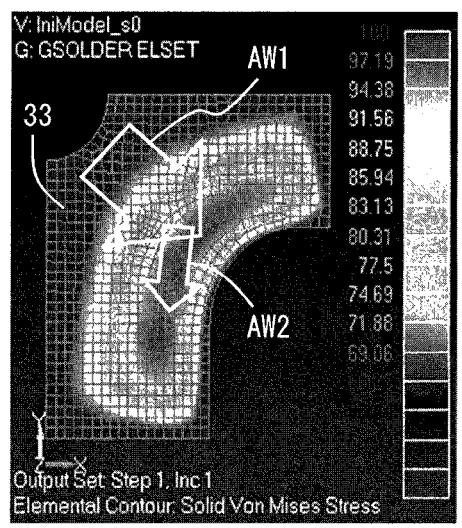
FIG. 13 is a stress distribution chart of the asymmetric external connection terminal illustrated in FIG. 11.

FIGS. 12 and 13 are stress distribution charts of the external connection terminals 32 and 33 illustrated in FIGS. 10 and 11.

The stress variations of the external connection terminals 32 and 33 were displayed in colors changing gradually from violet to red rainbow colors with larger stresses, and then transformed into gray images. FIGS. 12 and 13 show the gray images.

It is known from FIG. 13 that, as compared to the symmetric external connection terminal 32 of FIG. 12, a stress gradient is observed in the asymmetric L-shaped external connection terminal 33, in which an area subject to large stresses is spreading in the direction of an asymmetrically longer extension of the external connection terminal 33 (downward in FIG. 13).

Generally, crack is thought to make its way from a large stress area toward a small stress area. This strongly suggests that, in the symmetric external connection terminal 32 of FIG. 12, the stresses may be transmitted from the angular part farthest from the center of the base bottom surface, which is likely to be the origin of cracks, toward the virtual angular part CP as illustrated with an arrow AW1.

In the L-shaped asymmetric external connection terminal 33 illustrated in FIG. 13, an area subject to large stresses spreads in the direction of its asymmetrically longer extension, causing the stress gradient. It is contemplated, in this instance, that the stresses directed from the angular part farthest from the center of the base bottom surface, which is likely to be the origin of cracks, toward the virtual angular part CP as illustrated with the arrow AW1 may be affected by the asymmetrically longer extension illustrated with an arrow AW2 and shifted in the direction of its longer extension direction, i.e., the short-side direction (downward in FIG. 13).

The stress-transmitted direction thus shifted may effectively retard the transmission of stresses from the virtual angular part P farthest from the center O4 of the base bottom surface, which is likely to be the origin of cracks, toward the center of the bottom surface.

A stress simulation was also carried out for another asymmetric external connection terminal 33 L-shaped in plan view. In this external connection terminal, contrary to the external connection terminal 33 of FIG. 11, the length of side 10L extending in the long-side direction of the outer peripheral edge 22$a$ of the lower frame 22 was larger than the length of side 10W extending in the short-side direction of the outer peripheral edge 22$a$. Unlike the symmetric external connection terminal 32 of FIG. 12, a stress gradient was observed in this external connection terminal 33, in which an area subject to large stresses was spreading in the direction of its asymmetrically longer extension, i.e., the long-side direction of the outer peripheral edge 22$a$ of the lower frame 22. It is contemplated that the stresses directed from the angular part farthest from the center of the bottom surface toward the virtual angular part CP may be shifted in the long-side direction.

Figure 14:
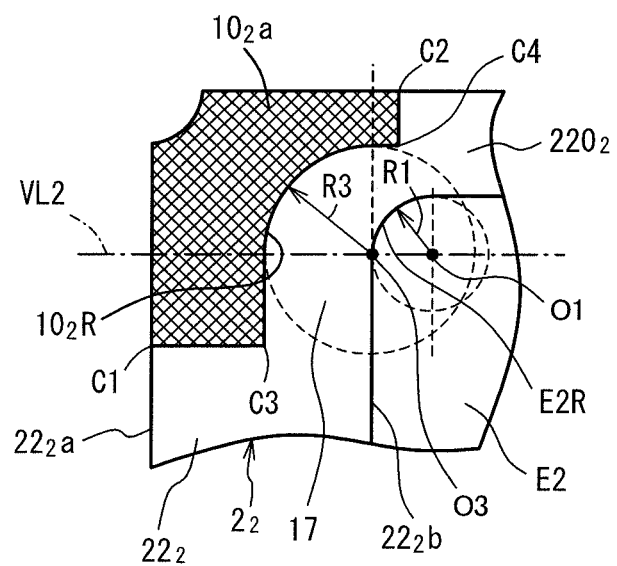
FIG. 14 is a partly enlarged bottom view of a crystal unit according to a modified example of the embodiment illustrated in FIG. 7.

FIG. 14 is a drawing illustrating a modified example of the embodiment of the second invention. The same structural elements as the ones according to the embodiment of the second invention are illustrated with the same reference symbols, and description of such structural elements is omitted. According to the embodiment of the second invention, the curvature radii of the two arc shapes (R1 and R2) are equal. On the other hand, this modified example uses different curvature radii.

Specifically, a curvature radius R3 of an arc shape $10_2$R (one-quarter portion of a circle) in each of four external connection terminals $10_2a$, $10_2b$, $10_2c$, and $10_2d$ (FIG. 14 illustrates the external connection terminal $10_2a$ alone as a typical example) is larger than a curvature radius R1 of an arc shape E2R (one-quarter portion of a circle) at each of four corners on an inner peripheral edge $22_2$-b of a bottom surface $220_2$ of a lower frame $22_2$ in a base $2_2$.

A center O1 of the arc shape at each of the four corners on the inner peripheral edge $22_2$-b of the bottom surface $220_2$ of the lower frame $22_2$ and a center O3 of the arc shape $10_2$R on the inner peripheral edge of the external connection terminal $10_2$-a lie on the same virtual straight line VL2 extending in the long-side direction of the outer peripheral edge $22_2a$ of the lower frame $22_2$ (left-right direction in FIG. 14).

Regardless of the different curvature radii (R1 and R3) of these two arc shapes, the stresses that may be transmitted from the base $22_2$ to the external connection terminal $10_2$-a may be effectively lessened. As a result, the occurrence of solder cracks may be suppressed in the microminiaturized crystal unit. The four corners on the inner peripheral edge of the lower frame $22_2$ are formed in the arc shape E2R in plan view to improve the lower frame $22_2$ in rigidity and make the base $2_2$ less deflectable. Further, the arc shape at one of the four corners on the inner peripheral edge of the lower frame $22_2$ improved in strength and the arc shape on the inner peripheral edge of the external connection terminal $10_2a$ are substantially the same shape. These structural features combined may further mitigate the stresses transmitted from the base $2_2$ to the external connection terminal $10_2a$.

According to this embodiment illustrated in FIG. 14, the angular part C4 of the external connection terminal $10_2$-a is not in proximity to the inner peripheral edge $22_2b$ in the arc shape E2R of the lower frame $22_2$. That is to say, the angular part C4 is not situated in the proximate region PA or the peripheral region SA illustrated in FIGS. 3 and 5.

According to the second invention, at least one angular part C4 of a plurality of angular parts C1, C2, C3, and C4 in the external connection terminal $10_2a$ is not in proximity to the inner peripheral edge $22_2$-b in the arc shape E2R of the lower frame $22_2$ as illustrated in the embodiment of FIG. 14.

In summary, a piezoelectric device according to the second invention includes:

a substrate portion;

an insulated container having a frame portion formed in at least an outer peripheral part of a main surface of the substrate portion that faces an external substrate;

an electronic component housed in a recess surrounded by the frame portion and the main surface of the substrate portion that faces the external substrate;

a piezoelectric element mounted on a main surface of the substrate portion opposite to the main surface mounted with the electronic component; and a lid for hermetic seal of the piezoelectric element, wherein the frame portion has an outer peripheral edge and an inner peripheral edge rectangular in plan view, and four corners on the inner peripheral edge have an arc shape in plan view, external connection terminals to be solder-bonded to the external substrate are each formed at four corners on a bottom surface of the frame portion with an electrode-absent region interposed between the external connection terminal and an inner peripheral edge of the bottom surface, and the external connection terminals each have an inner peripheral edge having an arc shape substantially corresponding to the arc shape at each of the four corners on the inner peripheral edge of the frame portion, and there is a center of the arc shape on the inner peripheral edge in each of the external connection terminals and a center of the arc shape at each of the corners on the inner peripheral edge of the frame portion.

According to a preferred embodiment of the second invention, the external connection terminals are formed in an L-like shape in plan view having sides extending from the four corners on the bottom surface of the frame portion along long side and short sides of the bottom surface, and a length of the side of the external connection terminal extending along the short side is larger than a length of the side of the external connection terminal extending along the long side.

According to the embodiments described thus far, the arc shapes at the four corners on the inner peripheral edge of the bottom surface of the lower frame and the arc shapes on the inner peripheral edge of the external connection terminals all have the shape of a one-quarter portion of a circle in plan view. This is, however, a non-limiting example, and the arc shapes in plan view may be otherwise.

According to the embodiments described thus far, the base has an H-shaped structure in plan view. This invention is also applicable to a base with a lower recess alone, wherein the lower recess is formed by a frame portion provided in an outer peripheral part of the lower surface of the substrate portion. In the base thus structured, the substrate portion has a flat upper surface, wherein the piezoelectric element mounted on the upper-surface side of the substrate portion may be hermetically sealed with a lid having a flange formed in its lower-surface side outer periphery that fits the outer upper-surface side periphery of the substrate portion.

The temperature sensor used in the embodiments described thus far is the thermistor, however, may be, for example, a diode. This invention is not limitedly applied to temperature sensor-embedded crystal units. The invention may also be applicable to piezoelectric oscillators with oscillator-embedded IC as an electronic component and temperature-compensated (TC) piezoelectric oscillators with TC circuit-embedded IC.

The invention may be carried out in many other forms without departing from its technical concept or principal technical features. The embodiments described so far are just a few examples of the invention in all aspects, which should not be construed to restrict the scope of the invention. The scope of this invention is solely defined by the appended claims, and should not be restricted by the text of this description. Any modifications or changes made within the scope of equivalents of the appended claims are all included in the scope of this invention.

The invention claimed is:

1. A piezoelectric device comprising:
an insulated container having a substrate portion and a frame portion, the frame portion being formed in an outer peripheral part of a main surface of the substrate portion that faces an external substrate;
an electronic component housed in a recess surrounded by the frame portion and the main surface of the substrate portion that faces the external substrate;
a piezoelectric element mounted on a main surface of the substrate portion opposite to the main surface mounted with the electronic component; and
a lid for hermetic seal of the piezoelectric element, wherein
the frame portion has an outer peripheral edge rectangular in plan view and an inner peripheral edge rectangular or square in plan view, and four corners on the inner peripheral edge of the frame portion have an arc shape or a chamfered shape in plan view,
four external connection terminals to be solder-bonded to the external substrate each have a shape with a bent portion in plan view in which each of the external connection terminals is extending from each of the four corners on a bottom surface of the frame portion in a long-side direction and a short-side direction of the outer peripheral edge of the frame portion, and each of the external connection terminals is spaced from an opening end of the recess with an electrode-absent region interposed therebetween,
each of the four external connection terminals has a plurality of angular parts in plan view, and at least one of the plurality of angular parts is in proximity to the inner peripheral edge of the frame portion in the arc shape or the chamfered shape at each of the four corners thereof,
the external connection terminals each have an L-like shape in plan view in which the external connection terminal is extending in different lengths in the long-side direction and the short-side direction of the outer peripheral edge of the frame portion,
one of the plurality of angular parts is situated in a proximate region or a peripheral region around the proximate region, the proximate region being defined by the inner peripheral edge of the frame portion in the arc shape or the chamfered shape at each of the four corners thereof, a first virtual straight line extending in the short-side direction along one side of the inner peripheral edge of the frame portion, and a second virtual straight line extending in the long-side direction along a side orthogonal to the one side of the inner peripheral edge of the frame portion, and
the peripheral region is a region relatively close to the proximate region and defined by a displaced first virtual straight line that is the first virtual straight line parallelly displaced by a first distance outward relative to the proximate region and a displaced second virtual straight line that is the second virtual straight line parallelly displaced by a second distance outward relative to the proximate region, the region further being defined by the displaced first and second virtual straight lines and third and fourth virtual straight lines orthogonal to the first and second virtual straight lines at arc or chamfer ending positions on the inner peripheral edge of the frame portion in the arc shape or the chamfered shape at each of the corners thereof, and the first distance is equal to or less than one-fourth of a frame width of a part of the frame portion extending in the short-side direction, and the second distance is equal to or less than one-fourth of a frame width of a part of the frame portion extending in the long-side direction.

2. The piezoelectric device as claimed in claim 1, wherein the one of the plurality of angular parts is situated in the proximate region.

3. The piezoelectric device as claimed in claim 1, wherein in the external connection terminals extending from the four corners on the bottom surface of the frame portion in the long-side direction and the short-side direction, ends of the external connection terminals are extending in the long-side direction and the short-side direction farther than the first virtual straight line and the second virtual straight line.

4. The piezoelectric device as claimed in claim 1, wherein lengths of extension of the external connection terminals extending in the short-side direction from the four corners on the bottom surface of the frame portion are larger than lengths of extension of the external connection terminals extending in the long-side direction from the four corners on the bottom surface of the frame portion, and the one of the plurality of angular parts is an angular part of an end of the external connection terminal extending in the long-side direction.

5. The piezoelectric device as claimed in claim 1, wherein the electronic component has a cuboidal shape and is housed in the recess in a manner that a longitudinal direction of the electronic component is orthogonal to the long-side direction of the frame portion.

6. The piezoelectric device as claimed in claim 1, wherein the four corners on the inner peripheral edge of the frame portion have an arc shape in plan view, the external connection terminals each have an inner peripheral edge in an arc shape substantially corresponding to the arc shape at each of the corners on the inner peripheral edge of the frame portion, and there is a displacement in the long-side direction between a center of the arc shape on the inner peripheral edge in each of the external connection terminals and a center of the arc shape at each of the corners on the inner peripheral edge of the frame portion.

7. The piezoelectric device as claimed in claim 6, wherein a curvature radius of the arc shape on the inner peripheral edge in each of the external connection terminals and a curvature radius of the arc shape at each of the corners on the inner peripheral edge of the frame portion are substantially equal.

\* \* \* \* \*